United States Patent [19]

Bax

[11] 4,437,053
[45] Mar. 13, 1984

[54] GRADIENT POWER SUPPLY

[75] Inventor: Ronald F. Bax, Columbia, Md.

[73] Assignee: Diasonics (NMR) Inc., South San Francisco, Calif.

[21] Appl. No.: 376,692

[22] Filed: May 10, 1982

[51] Int. Cl.³ .............................................. G05F 1/44
[52] U.S. Cl. .................................. 323/268; 323/274; 323/276; 323/284; 323/285; 323/350
[58] Field of Search ............................ 323/268–272, 323/274–277, 280, 283–285, 349–351, 902; 128/1.3–1.5, 653, 659

[56] References Cited

U.S. PATENT DOCUMENTS

| | | | |
|---|---|---|---|
| 3,745,477 | 7/1973 | Freeborn | 323/271 X |
| 3,770,986 | 11/1973 | Drehle | 323/351 X |
| 3,896,367 | 7/1975 | Frantz | 323/351 |
| 3,914,617 | 10/1975 | Corbel | 323/271 X |
| 4,290,007 | 9/1981 | Fisher et al. | 323/269 X |

FOREIGN PATENT DOCUMENTS 1221113 2/1971 United Kingdom.
1313512 4/1973 United Kingdom.
1353537 5/1974 United Kingdom.
1528625 10/1978 United Kingdom.
1571423 7/1980 United Kingdom.
2048009 12/1980 United Kingdom.

OTHER PUBLICATIONS

W. E. Schillinger, "Fast Inductive Load Current Switch Circuit", IBM Technical Disclosure Bulletin, vol. 24, No. 1A, Jun. 1981, pp. 199–200.

Primary Examiner—Peter S. Wong
Attorney, Agent, or Firm—Blakely, Sokoloff, Taylor & Zafman

[57] ABSTRACT

A power supply particularly suited for driving coils in a magnetic nuclear resonance device, or scanner, is described. Bipolar switches driven by field-effect devices are used to couple the coil to a high potential when a rapid current change is required, control devices also comprises bipolar transistors driven by field-effect transistors are used to control the current through the coil in steady state conditions.

20 Claims, 7 Drawing Figures

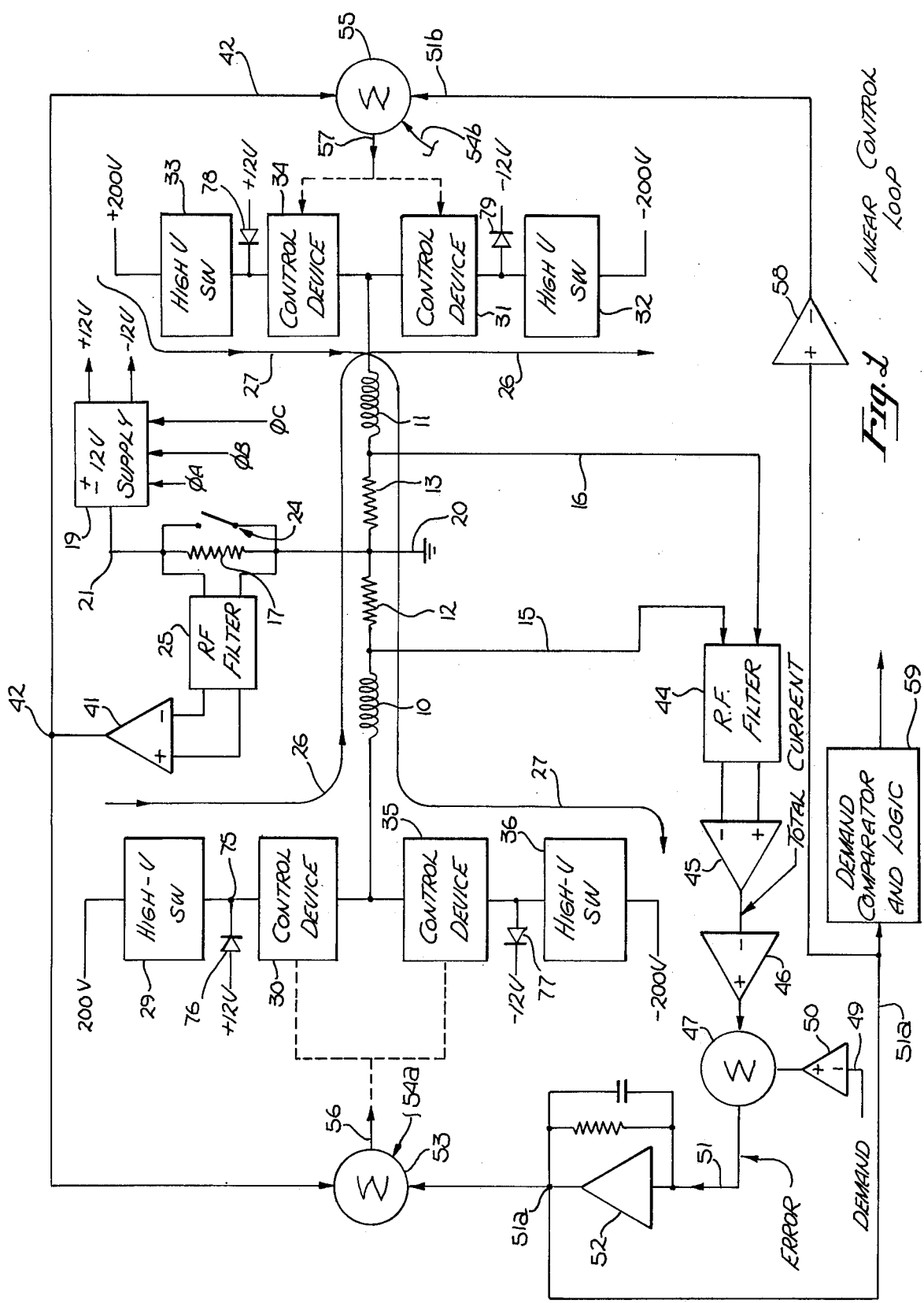

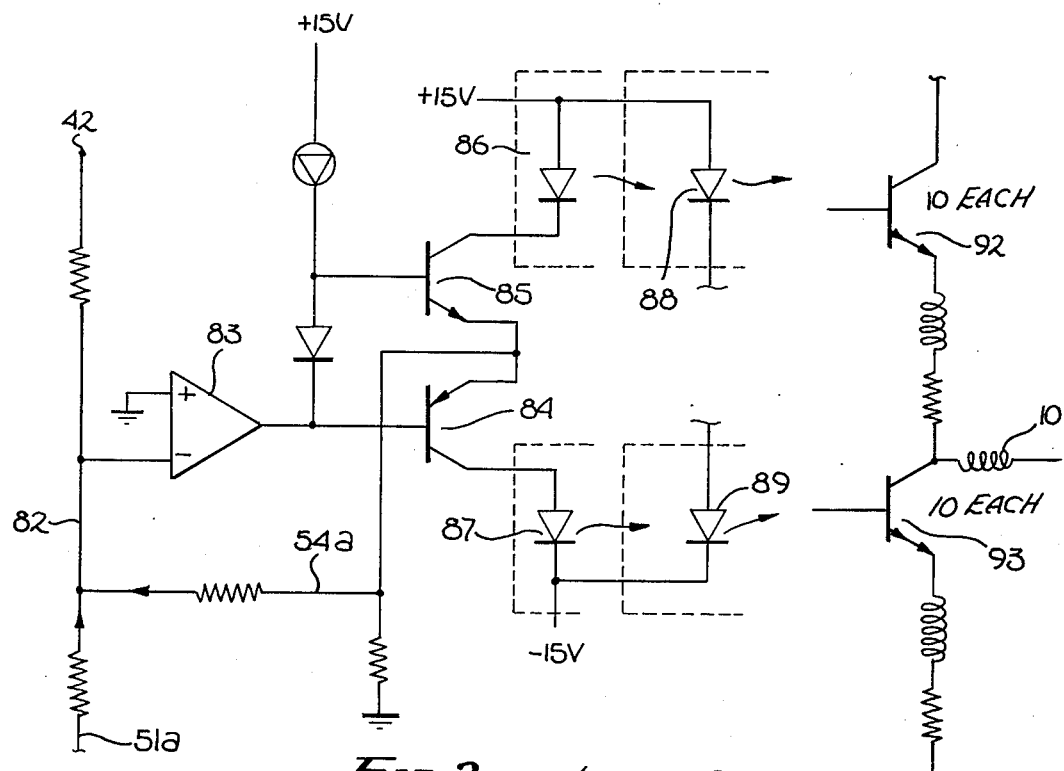
Fig. 2  LINEAR DRIVE
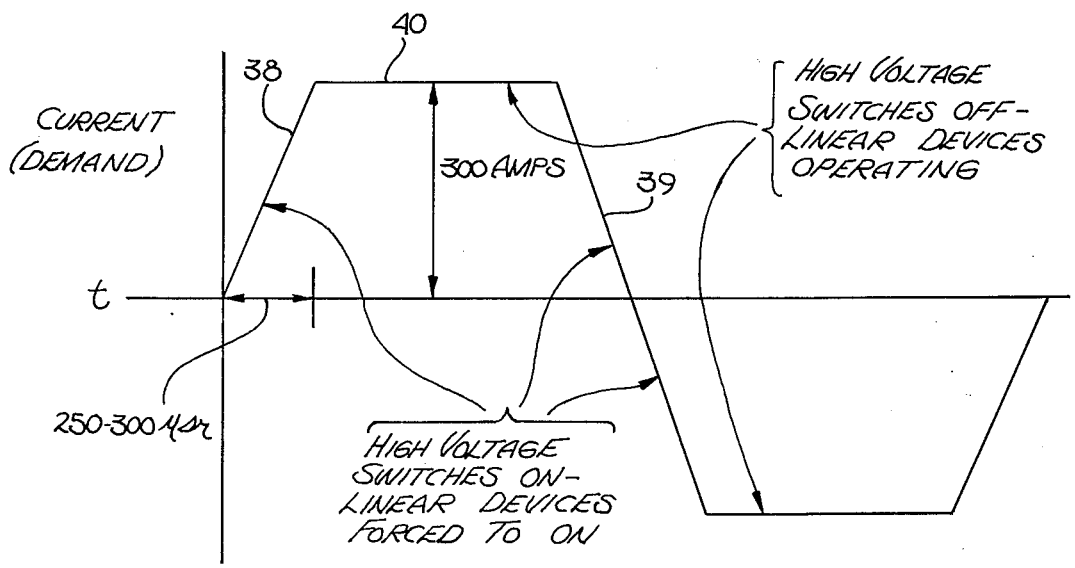
Fig. 3

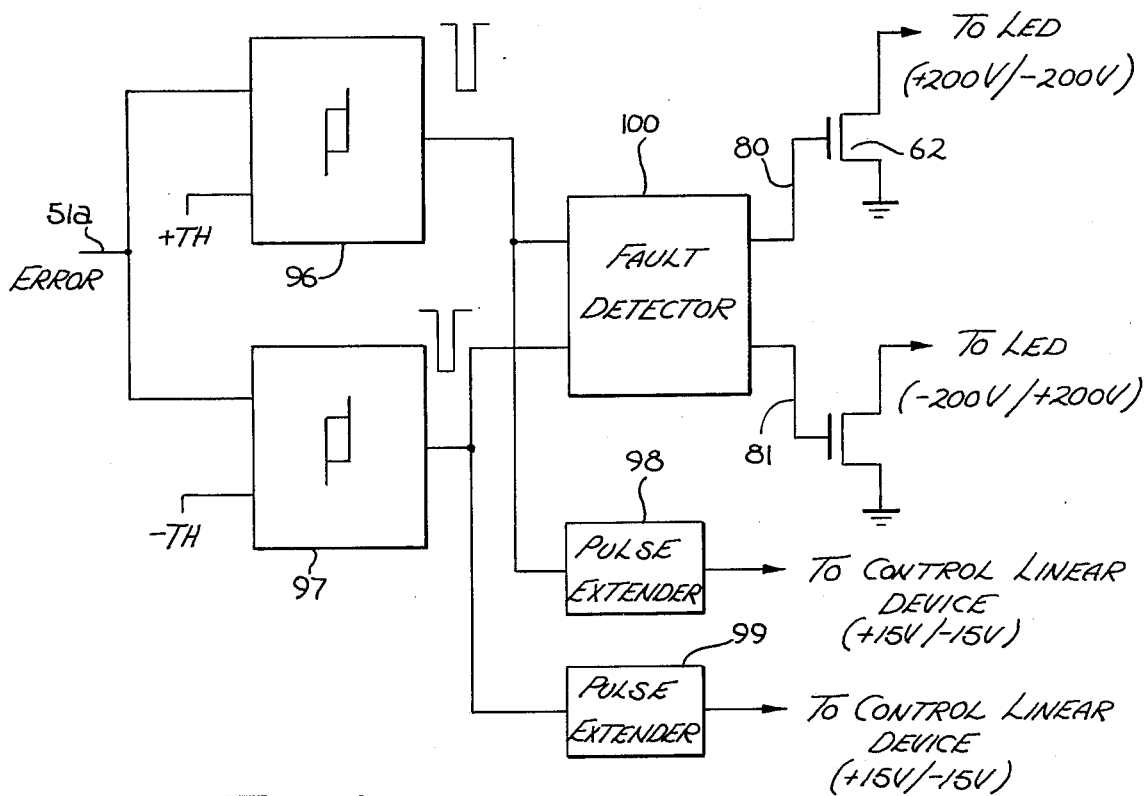
Fig. 4  DEMAND COMPARATOR AND LOGIC
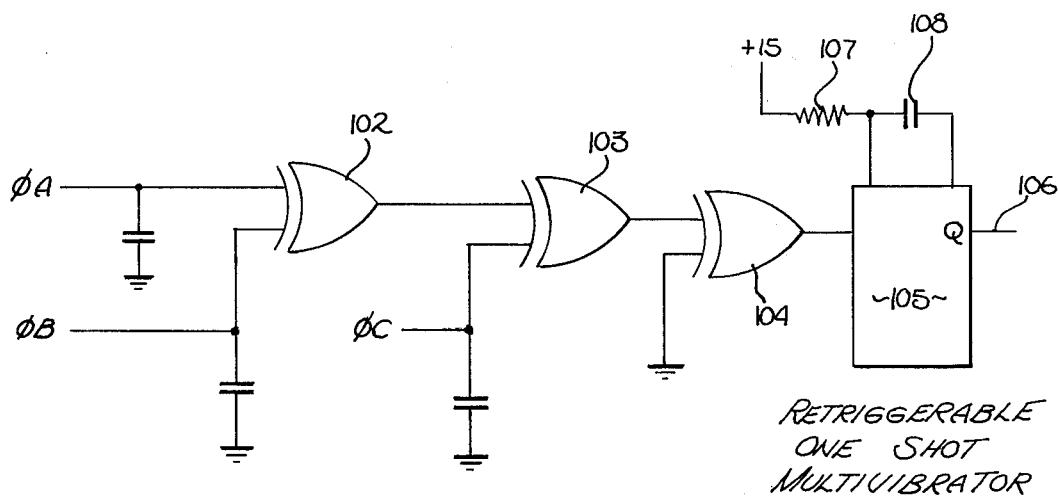
Fig. 6

HIGH VOLTAGE SWITCH & DRIVER

GRADIENT POWER SUPPLY

BACKGROUND OF THE INVENTION

1. Field of the Invention

The invention relates to the field of power supplies, particularly power supplies used in nuclear magnetic resonance scanners.

2. Prior Art

In medical nuclear magnetic resonance (NMR) scanners a patient is placed within a relatively high magnetic field (e.g., 3 k gauss). The hydrogen atoms of the body (or other specimens) are excited by a radio-frequency signal and then the radio-frequency signals emitted from the hydrogen atoms during the relaxation times of the atoms ($T_1$ and $T_2$) are sensed. It is known that the frequency of the emitted radio-frequency signals from the hydrogen atoms are a function of the magnetic field strength.

The magnetic field in these scanners is often made to uniformly increase or decrease in known directions during the time that the hydrogen atoms are excited by the radio signals. The frequency of the sensed radio signals then becomes a function of the magnetic field strength and hence, can be used to determine distance in the direction of the magnetic field gradient.

In one experimental NMR scanner, a cylindrical main coil is submerged in liquid helium. The current induced in this coil provides the uniform magnetic field (e.g., 3 k gauss). The patient is slid into a cylindrical member formed within the central region of the coil and therefore is disposed within the strong magnetic field. Three pairs of other coils (in air) are mounted on the vessel containing the main coil. The axes of the three coil-pairs are generally orthogonal to the main coil. By way of example, each coil-pair has an inductance of approximately 250 microhenries and a resistance of 0.01 ohms per end. With 300 amps passing through these coils, a uniform magnetic gradient is produced within the cylindrical opening of the scanner (e.g., 1 gauss per cm). The direction of this gradient can be changed by exciting different combinations of the coils.

For a general discussion of NMR medical imaging, NMR scanners and the sequencing of the currents through the gradient producing coils, see *Nuclear Magnetic Reasonance Imaging Medicine,* published by Igaku-Shoin, copyrighted 1981 and edited by Kauffman, Crooks and Margulis.

For some NMR imaging, the current through the gradient coils must be driven quickly to a high level (e.g., 300 amps in 250–300 microseconds), maintained at a steady state for a short period of time and then driven to zero or in the opposite direction to reverse the gradient. Moreover, the current through the coil pairs must be the same, otherwise the magnetic gradient will not be constant and the resultant image will appear to be flattened or expanded in some regions.

In a prior art gradient power supply, a plurality of bipolar transistors are coupled in parallel to control the flow of current through the gradient producing coils. These transistors are in saturation when conducting. When the transistors are turned off, the last one of the transistors to turn off sometimes receives the entire current, that is, the current intended for all the parallel transistors. When this occurs, the transistor can be destroyed. This and other shortcomings to the prior art power supply has led to the development of the power supply described in this application.

SUMMARY OF THE INVENTION

An apparatus for driving a coil particularly suited for an NMR scanner is described. A first and a second source of potential are employed, the second potential being lower than the first potential. Switching means are coupled to the first potential and used to switch this potential. A control device for controlling the flow of current has one of its terminals coupled to both the second source of potential and to the switching means. The other terminal of this control device is coupled to the coil. Control means causes both the switching means and control device to conduct when the current through the coil is required to rapidly change, and causes only the control device to conduct when the current through the coil is in a steady state. Thus, the coil is driven from the higher potential when high rates of change in current are required and from the lower potential during steady state conditions.

In the presently preferred embodiment, the switching means comprises a plurality of parallel bipolar transistors driven by field-effect devices. Also the control device comprises a plurality of bipolar transistors, driven by field-effect devices.

Numerous other aspects of the invented power supply are described in the detailed description.

BRIEF DESCRIPTION OF THE DRAWINGS

FIG. 1 is a block diagram illustrating the general layout of the invented power supply and also illustrating the linear control loop which controls the control devices.

FIG. 2 is a partial electrical schematic of one of the linear driver circuits used to drive the control devices.

FIG. 3 is a waveform used to describe the operation of the power supply of FIG. 1.

FIG. 4 is a block diagram of the demand comparator and logic means shown in FIG. 1.

FIG. 6 is an electrical schematic of a fault detection circuit used to detect the failure of one or more phases in a three-phase power supply.

DETAILED DESCRIPTION OF THE INVENTION

Figure 5:
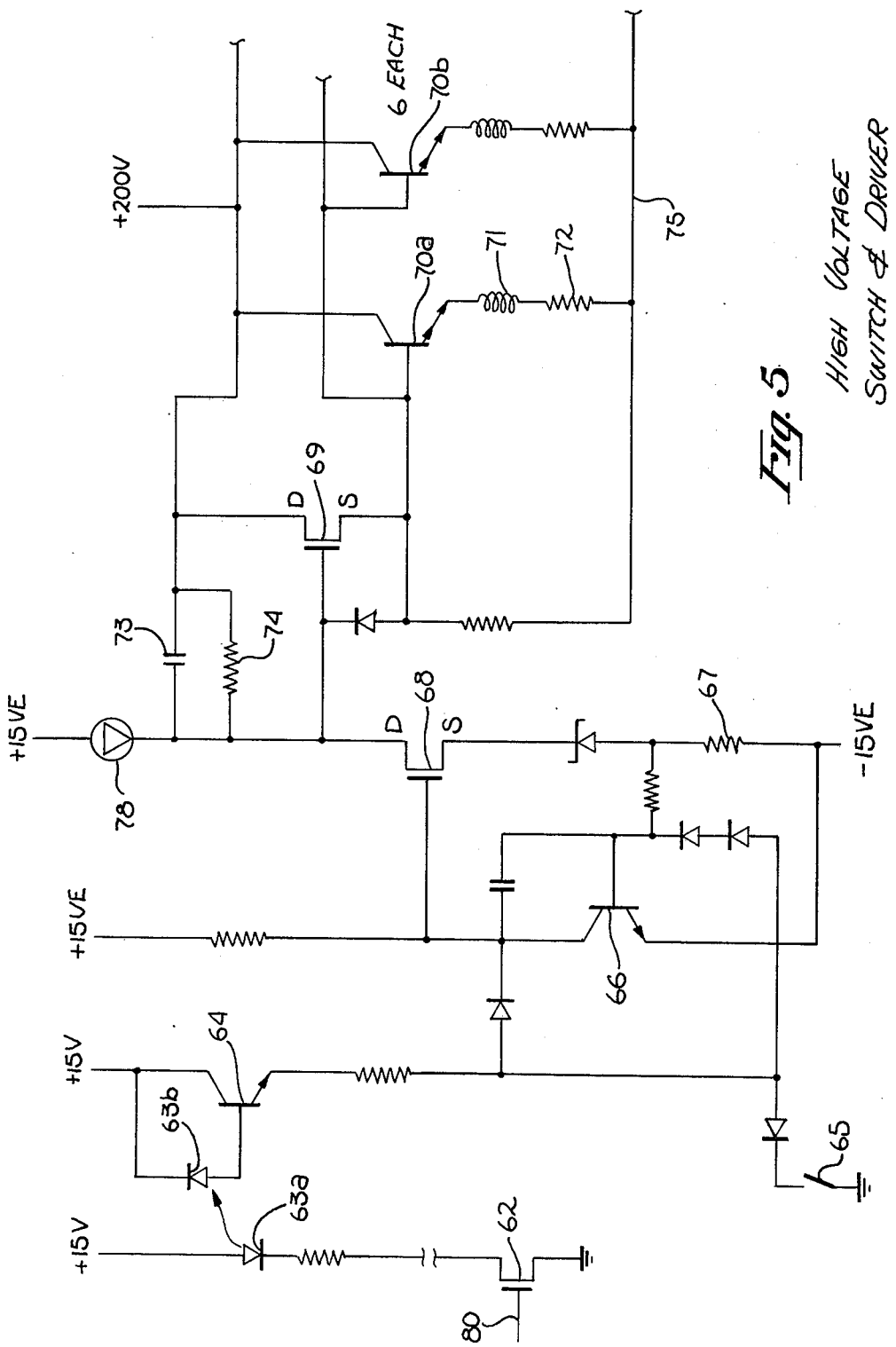
FIG. 5 is an electrical schematic of the driver circuit used to drive the high voltage switches.

A power supply is described which is particularly useful in a nuclear magnetic resonance (NMR) scanner. The power supply drives coils which provide a magnetic gradient and hence, is sometimes referred to as a gradient power supply. In the following description, numerous specific details are set forth in order to provide a thorough understanding of the present invention. However, it will be obvious to one skilled in the art that the present invention may be practiced without these specific details. In other instances, well-known circuits and technology have not been described in detail in order not to obscure the present invention in unnecessary detail.

As previously mentioned, the power supply drives gradient producing coil-pairs which are disposed about a main coil. By way of example, three coil pairs are mounted about the housing which contains the main winding. One coil-pair is shown in FIG. 1 as coils 10 and 11. (The major portions of the power supply described below (particularly of FIG. 1) which drive each coil-pair are duplicated for each coil-pair.) These coil-pairs are generally formed from bars and in one embodiment, as mentioned, have an inductance of 250 microhenries and a resistance of 0.01 ohms per end section.

A typical waveform for the current through the coils 10 and 11 which is provided by the described power supply is shown in FIG. 3. To obtain good imaging, the rise time and decay time of the current should be symmetrical and the maximum current (300 amps) maintained relatively constant. The current through the coil 10 must equal the current through the coil 11, otherwise image distortion results.

The coils 10 and 11 are coupled in series with resistors 12 and 13. These resistors have relatively low resistance (e.g., 0.001 ohms) and are used to provide a voltage on lines 15 and 16 proportional to the total current through both coils. The common junction between the resistors 12 and 13 is coupled to ground and also to a resistor 17. As will be described in greater detail, the coils 10 and 11 are driven during steady state conditions from a ±12 volt power supply 19. This power supply is coupled to a separate ground 21. If the current through the resistors 12 and 13 is equal, return 21 will be at the same potential as ground 20. Otherwise, a potential is present across resistor 17 which is proportional to the imbalance in the current in coils 10 and 11.

In the presently preferred embodiment, resistor 17 has a relatively low resistance (e.g., 0.01 ohms). If a major imbalance occurs in the currents, for instance, if coil 11 were to become open, a substantial current could flow through resistor 17. This would require that resistor 17 have a large heat capacity. In the presently preferred embodiment, resistor 17 will handle only 500 watts. A shunting relay 24 is placed across the resistor 17 to turn off the current in the event of a major fault, that is, a major imbalance in currents.

The relay 24 is not needed if resistor 17 has a relatively low resistance. However, if a low resistance is used, a substantial amount of noise is amplified by the increased gain made necessary by this lower value, and coupled to the filter 25. To prevent this, the high resistance is used along with the shunting relay.

Current for the coils 10 and 11 is supplied from both a pair of high voltage supplies (+ and −200 volts) and a lower voltage pair (+ and −12 volts). In general, current is drawn from the high voltage supplies when a rapid change in current is required and from the low voltage supplies when a steady state current is needed in the coils. When a high rate of current change is required in one direction, current flows from the +200 volt supply through the high voltage switch 29, control device 30, through the coils and then through control device 31 and high voltage switch 32 to the −200 volt supply. Whenever a circuit consists of a proliferation of diodes, NPN transistors, or N-Channel field effect transistors, it is often easier to envision current as flowing from + to −, or "with the arrows." In actuality, electron flow is from − to +. The + to − convention is used as a visual aid. This path is generally shown by line 26. When a high rate of current change is required in the other direction (or to reduce the current in the first direction), it flows from the +200 volt power supply through the high voltage switch 33, control device 34, through the coils, through control device 35 and high voltage switch 36 to the −200 volt supply. This is generally shown by path 27. During the period of H.V. application, the low voltage diodes are forced off.

Each of the high voltage switches 29, 32, 33 and 36 consists of bipolar transistors and driving circuitry which will be described in detail in conjunction with FIG. 5. The control devices 30, 31, 34 and 35 also include bipolar transistors; these devices are described in detail in conjunction with FIG. 2.

In general, when a high rate of change of current is required, such as for slopes 38 and 39 of FIG. 3, a pair of high voltage switches (29 and 32 or 33 and 36) and a pair of the control devices (30 and 31 or 34 and 35) are forced to full conduction. During the steady conditions as illustrated by segment 40 of FIG. 3 the high voltage switches are off and the control devices provide the current for the coil from the + and −12 volt supplies. If current is flowing from the +12 volt supply thorough diode 76, control device 30, through the coils and then through control device 31 and diode 79 to the −12 volt supply, the control devices 34 and 35 are also on to some extent. The control devicees 34 and 35 allow small amounts of current to be added or taken from the coils and enable the current in the coils to be balanced. With 34 and 35 in slight conduction, there is minimal delay and crossover distortion when small but fast corrective reversals in coil current are required. All the control device operate as generally linear devices during this time. The control loop used for this purpose is shown in FIG. 1.

The linear control loop of FIG. 1 includes a dual radio-frequency filter 25 which receives the signal representative of the current imbalance from the resistor 17. The outputs of the filter pass through a differential amplifier 41 to provide a analog signal on line 42 representing the total imbalance of the current between the coils. This signal is coupled both to summers 53 and 55.

The signal on lines 15 and 16 is also passed through a radio frequency filter 44 and then coupled to a differential amplifier 45. The signal at the output of this amplifier represents the total current passing through coils 10 and 11. This signal, after passing through an inverting amplifier 46, is coupled to a summer 47.

A signal representing the demand, that is, the desired current through the coils 10 and 11 is coupled to line 49. This signal, may for instance, resemble the waveform of FIG. 3. After this signal passes through the inverting amplifier 50 it is coupled to the summer 47. The output of the summer 47 (line 51) represents an error signal, that is, the error between the actual current passing through the coils and the desired current.

Line 51 is coupled through an operational amplifier 52 which provides gain and stability to the control loop. The output of this amplifier (line 51a) is coupled to the summer 53, demand comparator and logic means 59 and to the inverting amplifier 58. The output of the inverting amplifier 58 (line 51b) provides another input for the summer 55. Each of the summers 53 and 55 receive a local feedback signal (lines 54a and 54b) which will be described in detail in conjunction with FIG. 2.

As may be seen from FIG. 1, the summer 53 receives both a demand error signal and the signal representative of the current imbalance and then provides a signal on line 56 which drives the control devices 30 and 35 in somewhat of a push-pull arrangement as also will be described in conjunction with FIG. 2. Similarly, the summer 55 receives the inverse of the error signal and the signal on line 42. It provides a driving signal on line 57 for the control devices 31 and 34.

In general, when the error signal applied to means 55 exceeds a predetermined threshold, it causes a selected pair of the high voltage switches (e.g., 29 and 32) to turn on and forces a pair of the control devices (e.g., 30 and 31) to fully conduct. Otherwise, the high voltage switches are off and the current is controlled by the control devices alone, via the low voltage diodes as mentioned.

In FIG. 5, a high voltage switch such as switch 29 of FIG. 1 is illustrated. Node 75 of FIG. 1 is shown along with the coupling to the +200 volt power supply. The +200 volt power supply is coupled to the node 75 and hence, to the coil through the control device by a signal received on line 80. This line and the transistor 62 are also illustrated in FIG. 4.

The high voltage switch and driver of FIG. 5 generally includes an input stage associated with transistors 62 and 64, a predriver stage associated with transistors 66 and 68, and a power driver stage (transistor 69) which drives the power transistors 70a, 70b, and four like transistors.

The input signal on line 80 is coupled to a field-effect transistor 62. When this transistor conducts, the light emitting diode (LED) 63a optically couples light to diode 63b which in turn causes the transistor 64 to conduct. The diodes 63a and 63b and transistor 64 are part of a standard opto-coupled package (HCPL-2502, in the presently preferred embodiment). The conduction of transistor 64 provides a current through the series diode to the pre-driver stage and in particular to the base of transistor 66. Switch 65 is part of the power supply's fault detection system, and in the event a fault is detected, this switch is closed, causing the current from transistor 64 to be directed to ground. The transistor 66 is used to provide a somewhat constant current when it is conducting through the resistor 67. Transistor 66 along with tthe resistor 67 and associated diodes and resistors operate somewhat like a current mirror and maintain a constant current in resistor 67 when the field-effect transistor 68 is conducting. This current in the presently preferred embodiment is approximately 20 milliamps. This constant current allows transistor 68, and hence transistor 69, to be switched quickly and smoothly.

It should be noted that some of the circuit components are shown connected to a potential + or −15 VE such as the constant current source 78. These are floating + and −15 volt power supplies which are referenced to node 75.

When a signal is applied to line 80, causing transistor 62 to conduct, transistor 64 conducts. The emitter current flow from transistor 64 is coupled to the base of transistor 66 through the series diodes. Transistor 66 then conducts more heavily, bringing the gate of the field-effect transistor 68 low, thereby reducing conduction in this transistor. When this occurs, the gate of transistor 69 is pulled toward the +200 volt potential through the resistor 74, and constant-current diode 78. (The resistor 74 also serves as a feedback path with capacitor 73). As transistor 69 conducts, it raises the bases of transistors 70a and 70b towards the 200 volt potential, thus this relatively high voltage is coupled to node 75 and from there to the coils.

In the presently preferred embodiment, the transistors 70a and 70b each comprise a Darlington pair of npn transistors. The Darlington pair is signified by the double arrows on the emitter terminals of the transistors 70a and 70b. An equalizing inductor 71 and resistor 72 are coupled in the emitter path of each of the main switching transistors. The inductor prevents a rapid decay of current through the transistor during turnoff, and tends to prevent the current in a given transistor from being diverted into another transistor as the transistors are turned off. The overall effect is to cause a slower turn-off and forced-current sharing.

In many prior art power supplies, including gradient power supplies, transistors such as transistors 70a and 70b are driven with their base at a higher potential than their collector (fully saturated). This forward biases the base-collector junction. When the transistors are turned off, the stored charge associated with these forward biased junctions prevents all the parallel transistors from turning off at the same time. The last transistor to turn off sometimes receives a current substantially greater than it is able to handle and may be destroyed.

With the circuit of FIG. 5, the field-effect transistor 69 keeps the collector and base of transistors 70a and 70b at the same potential during conduction, thus there is no stored charge since the base-collector junction is not forward biased. All the transistors can then be turned off at the same time, preventing a large surge in any one transistor.

Since the base and collectors of the transistors are maintained at the same potential as described above, more heat is dissipated by the transistors than for cases where the transistors are fully saturated. For the present application, the disadvantage of additional heat from the transistors is considered to be outweighed by the advantage of being able to assure that all the transistors cease to conduct at the same time. In the presently preferred embodiment, transistors 70a and 70b and like transistors and the main bipolar transistors associated with the control devices are mounted on water cooled heat exchangers. A closed cycle water cooling system is used to remove the heat from these transistors in a well-known manner.

Referring now to FIG. 2, a pair of control devices such as 30 and 35 of FIG. 1 are partially illustrated. The common connection between transistors 92 and 93 is coupled to the coil 10. The collector of transistor 92 is coupled to the node 75 of FIG. 1 and the emitter of transistor 93 is coupled to both a −12 volt power supply through a diode and one terminal of the high voltage switch 36. A mirror image of the circuit of FIG. 2 is used for the control devices 31 and 34.

The summing represented by summer 53 of FIG. 2 is realized on node 82 of FIG. 2. The error signal is coupled to this node on line 51a, the signal representing the imbalance of currents in the coils on line 42 and the local feedback signal is coupled to the node on line 54a. The summed potential on node 82 is coupled through an amplifier 83 to provide a push-pull driving signal for the transistors 84 and 85. These transistors drive the LEDs 86 and 87. The light emitted by these diodes is used to control the current through transistors 92 and 93 in a driver arrangement similar to that shown in FIG. 5. Once again, field-effect transistors are used for driving transistors 92 and 93. However, rather than driving the transistors 92 and 93 in a switching mode, these transistors operate in a linear region when the diodes 88 and 89 are not conducting.

The linear drive of FIG. 2 includes two additional light emitting diodes used to generate additional driving signals for transistors 92 and 93. When the high voltage switching transistors are on, one of diodes 88 or 89 conducts causing either transistor 92 or transistor 93 to fully conduct, that is, the collector and base are brought to the same potential by a field-effect device. The circuit for activating the diodes 88 and 89 with the correct logic is shown in FIG. 4.

As was the case for the switching transistors, the transistors 92 and 93 are Darlington pairs and ten such transistors are coupled in parallel between, for example, node 75 of FIG. 1 and the coil 10.

The demand comparator and logic means 59 of FIG. 1 as shown in FIG. 4 receives the error signal on line 51a and couples it to Schmitt triggers 96 and 97. Schmitt trigger 96 receives a positive threshold potential and provides a output pulse whenever the error signal exceeds this threshold potential.

The Schmitt trigger 97 provides an output signal whenever the error signal exceeds the negative threshold (in the negative direction). The output from the Schmitt triggers is passed through a fault detector 100. This fault detector includes a number of logic gates arranged to detect simultaneous outputs from both Schmitt triggers. Obviously, if the Schmitt triggers provide simultaneous outputs, a fault exists in the circuitry. An output from the detector 100 is used to disable the drive and prevent damage to the power supply. The output of Schmitt trigger 96 is coupled to both transistors 62 (line 80) and to the delay means 98. The output of the Schmitt trigger 97 is similarly coupled to a field-effect transistor (via line 81) and to a delay means 99.

Assume that a signal representing a large current demand is placed on line 49 of FIG. 1. The error signal on line 51a as mentioned represents the difference between this demand and the actual current through the coils. Further assume that the error signal exceeds a predetermined threshold, more specifically, the threshold associated with the Schmitt trigger 96. This causes an output signal from the Schmitt trigger 96 which is coupled through the fault detector 100 to the transistor 62. Referring briefly to FIGS. 1 and 5, when transistor 62 conducts the switch 29 of FIG. 1 conducts. Transistor 62 is coupled to the LED associated with switch 32 and causes that switch to conduct also. The output from the Schmitt trigger 96 is immediately coupled through the pulse extender 98 to diode 88 of FIG. 2 and causes it to conduct. Similarly, the corresponding diode within the control device 31 conducts. Thus, current flows from the +200 volt potential to the −200 volt potential along the path 26 of FIG. 1.

When the output of the Schmitt trigger 96 drops and assuming that no output exists from trigger 97, high voltage switches 29 and 32 cease to conduct. A few microseconds later, diode 88 of FIG. 2 ceases to conduct and the control devices operate as linear device as described in conjunction with the linear control loop of FIG. 1. This corresponds to the segment 40 of FIG. 3.

If the error signal exceeds the negative threshold, then an output occurs from the Schmitt trigger 97. This would occur along slope 39 of FIG. 3. The signal on line 81 of FIG. 4 causes the high voltage switches 33 and 36 to conduct and the output of the pulse extender 99 causes the control devices 34 and 35 to conduct.

The pulse extenders 98 and 99 are ordinary circuit means for providing a delay on the trailing edge of the pulses from the Schmitt triggers. This causes the high voltage switches to be turned off before the control devices are returned to their linear mode. This allows the high voltage switches to interrupt the current from the high voltage supply rather than the control devices.

The power supply of the present invention includes numerous fault detection means for detecting faults in the power supply. If a fault is detected as will be described in conjunction with FIG. 7, the power supply is shut down. This avoids damage to the power supply. This is particularly important where a power supply includes many expensive components such as the bipolar transistors of the high voltage switches and control devices. Well-known circuits are used for detecting excessive or low, currents and voltages. One such fault detector, as described, is used to close the relay 24 of FIG. 1 and shunt resistor 17. Another is used to close the switch 65 of FIG. 5 to prevent driving the high voltage switch. Still another is shown as fault detector 100 of FIG. 4 as mentioned. An additional fault detector is shown in FIG. 6 and will be described below.

The direct current + and −200 volt supply and + or −12 volt supply are obtained from a standard three phase AC (60 hz) power source. For example, as shown in FIG. 1, the supply 19 receives phase A, B and C. The AC current is rectified in an ordinary manner and stored on large capacitors as is common. Ripple filters are used to remove the ripple from the rectified waveform. If one of the phases are lost, considerably more ripple occurs with the ripple filters and rectifiers on the remaining phases becoming overloaded and consequently damaged. Thus, it is desirable to sense the loss of one of the phases and in the event of such a loss, remove the load from the power supplies.

A circuit for detecting the loss of one or more of the phases from a three phase power source is illustrated in FIG. 6. Two phases of the power are coupled to an exclusive OR gate 102. The output of the OR gate 102 is coupled to one input terminal of the exclusive OR gate 103. The third phase is coupled to the other input terminal of gate 103. The waveform at the output of gate 103 is a square wave. Gate 104 receives this output and is used to "square up" the waveform. The output of the gate 104 is coupled to the input terminal of a re-trigerable one-shot multivibrator 105. The time constant of this multivibrator is set by the resistor 107 and the capacitor 108. It is set to correspond to a period slightly longer than the period of the waveform from the gate 104. Normally, the output of the gate 104 continually triggers the multivibrator 105 and the signal on line 106 remains high. If one or more phases of the AC signal are lost, gaps appear in the square wave at the output of gate 104. These gaps are longer in duration than the time constant associated with resistor 107 and capacitor 108. Under these conditions, the Q output from the multivibrator drops. This drop is sensed and used to shut down the power supply.

Figure 7:
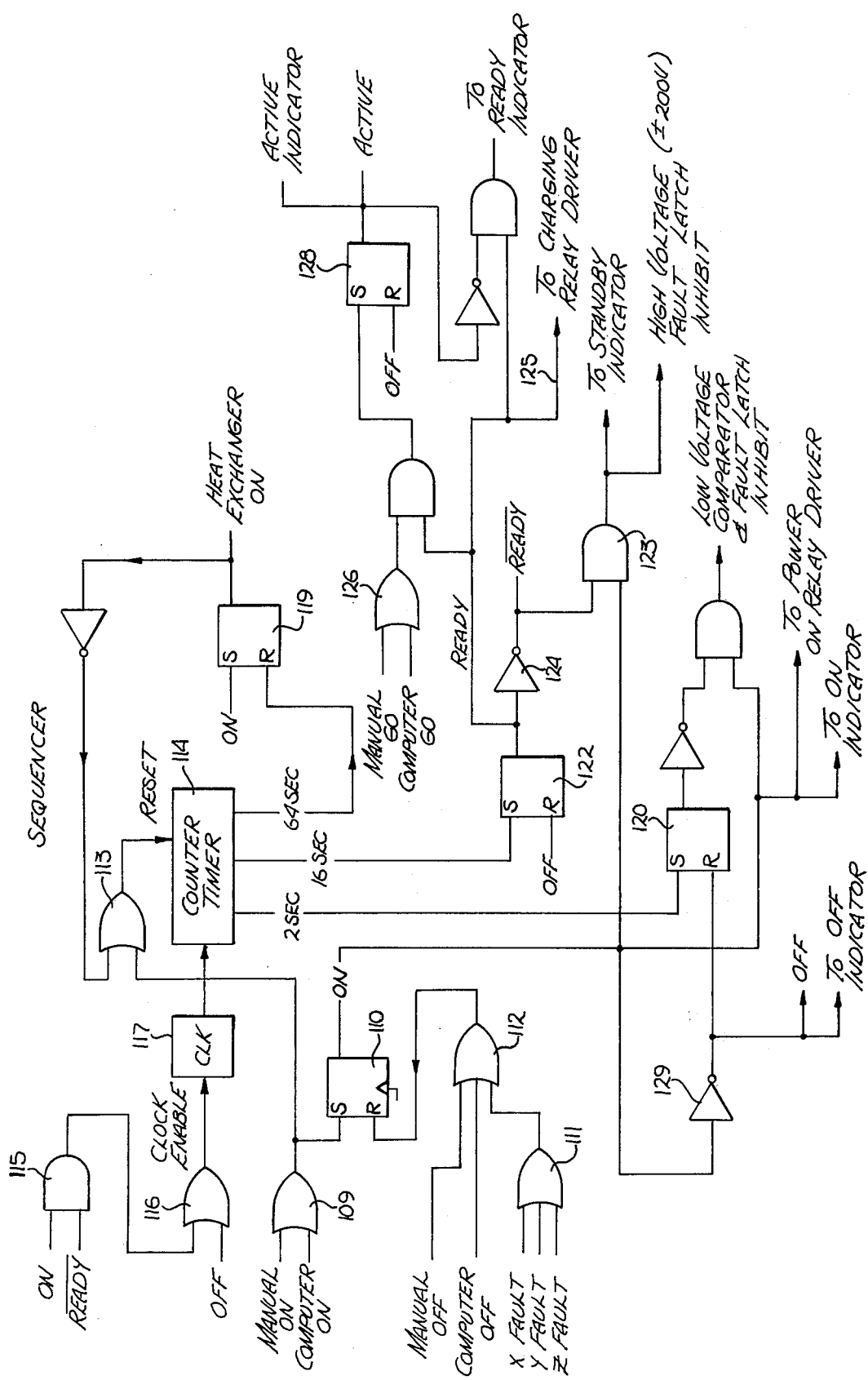
FIG. 7 is a block diagram of a sequencer used to control the invented power supply.

The sequencer of FIG. 7 is used to control the turning on and off of the power supply, heat exchanger, and to provide various signal indications such as standby, on, etc. It receives on signals and off signals from either a computer or from manual inputs and also signals indicating that a fault has occurred. These latter inputs are shown coupled to the OR gate 111. When a momentary on signal is received at the OR gate 109, it sets the flip-flop 110 to provide the ON signal for the sequencer. The output of gate 109 resets the counter/timer 114. The ON pulse is supplied to the AND gate 115 as is an inverted ready signal; this enables clock 117 through the OR gate 116. The counter thus begins to count and at two seconds the flip-flop 120 is set. When this occurs, the low voltage comparator fault detector is allowed and several status indicators are activated. At this time, the flip-flop 122 has not been set, thus the output of AND gate 123 is high (not that this signal passes through inverter 124) disabling the high voltage fault latch.

During this time (up to 16 seconds) the power on relay driver allows the capacitors in the power supplies to be charged through a resistor to prevent too much current being drawn from the rectifiers. At 16 seconds flip-flop 122 is set providing a ready signal. This ready signal on line 125 shunts the charging resistor used to charge the power supply capacitors and provides signals used to indicate that the power supply is ready for use. The inverted ready signal applied to gate 115 drops in potential and thus there are no high inputs to gate 116. Clock 117 ceases to count and the counter/timer 114 stops counting at the 16 second interval. At this time, the power supply may be used and in fact when a go signal is applied to gate 126, the active indicator is set by gate 128.

If a fault occurs or if the system is turned off, an output occurs from the gate 122 resetting flip-flop 110. The ON signal drops and the OFF signal rises in potential because of the inverter 129. This signal resets the flip-flop 122 and causes the ready signal to rise in potential. The OFF signal applied to the gate 116 once again enables the clock 117. The clock now begins to count and will count until it reaches 64 seconds. The purpose of the continued count between 16 seconds and 64 seconds is to cause the heat exchanger to remain on, thereby removing the residual heat from the water cooled components. Note that initially the ON signal sets flip-flop 119 turning on the heat exchanger.

Thus, a power supply has been described which is particularly useful for providing a gradient magnetic field in a nuclear magnetic resonance scanner. Ordinary bipolar and field-effect devices are employed throughout the power supply thus allowing it to be fabricated with commercially available components. The supply has numerous advantages over prior art gradient power supplies such as greater reliability.

I claim:

1. A power supply for driving a coil comprising:
a source of a first potential;
a source of a second potential, said second potential being lower than said first potential;
switching means coupled to said first potential for switching said first potential;
a control device for controlling the flow of current, said device coupled in series with said switching means and said source of said second potential at one of its terminals and the other of its terminals being coupled to said coil;
control means for causing both said switching means and control device to conduct when current flow is being changed within said coil and for causing said switching means to cease conducting and said control device to conduct when the current through said coil is at a steady state, said control means being coupled to said switching means, control device and said coil;
whereby the current in said coil may be driven to a high level primarily with current from said first source of potential and then maintained at said high level with current supplied primarily from said second source of potential under control of said control devices.

2. The power supply defined by claim 1 including sensing means for sensing the current through said coil, said sensing means being coupled to said control means for controlling the current through said control device and to said coil.

3. The power supply defined by claim 2 wherein said switching means comprises a plurality of first bipolar transistors and wherein said bipolar transistors are driven by at least a first-field device.

4. The power supply defined by claim 3 wherein said control device comprises a plurality of second bipolar transistors and wherein said plurality of said second bipolar transistors are driven by at least a second field-effect device.

5. The power supply defined by claim 2 including comparator means for comparing said sensed current with a signal representative of the desired current and for causing said switching means and control means to conduct if the difference between said sensed current and said desired current exceeds a predetermined level, said comparator being coupled to said control means.

6. The power supply defined by claim 5 wherein said comparator means forces said control device to heavily conduct when said switching means is conducting and to operate as a linear device under control of said control means when said switching means is not conducting.

7. The power supply defined by claim 1 including fault detection means for detecting faults in said power supply and for preventing conduction in said coil when said faults are detected.

8. The power supply defined by claim 7 wherein said first and second source of potentials are direct current potentials derived from a three-phase power supply and wherein said fault detection means comprises means for detecting the loss of one or more of said phases.

9. A power supply for driving a coil comprising:
a source of a first potential of a first polarity and of an opposite polarity;
a source of a second potential of a first polarity and an opposite polarity, said second potential being less than said first potential;
first switching means coupled to said first potential of said first polarity for switching said first potential;
second switching means coupled to said first potential of said opposite polarity for switching said first potential;
a first control device for controlling the flow of current, one terminal of said first control device being coupled to said source of said second potential of first polarity and to said first switching means, the other terminal of said first control device being coupled to one terminal of said coil;
a second control device for controlling the flow of current, one terminal of said second control device being coupled to said second potential of said opposite polarity and to said second switching means, the other terminal of said second control devices being coupled in series with the other terminal of said coil; and,
control means for causing said first and second switching means and said first and second control devices to conduct when the current in said coil is being changed at a rate greater than a predetermined rate and for causing said first and second switching means to cease conducting and said first and second control means to conduct when the current through said coil is in a steady state condition, said control means being coupled to said coil, said switching means, and said control devices;

whereby power from said first potential is used to drive said coil when the current through said coil is rapidly being changed, and whereby, power from said second source of potential is used to maintain a steady state current through said control devices when the current through said coil is relatively constant.

10. A power supply for driving a first and a second coil, said coils being coupled in series, comprising:
   a source of a first potential of a first polarity and of an opposite polarity;
   a source of a second potential of a first polarity and an opposite polarity, said second potential being less than said first potential;
   first switching means for switching said first potential, said first switching means coupled to receive said first potential of said first polarity;
   first control device for controlling the flow of current, one terminal of said first control device being coupled in series with said first switching means and to said source of said first potential of said first polarity, the other terminal of said first control device being coupled to one terminal of said first coil;
   a second switching means for switching said first potential, said second switching means being coupled to receive said first potential of said opposite polarity;
   a second control device for controlling the flow of current, one terminal of said second control device being coupled to the source of said second potential of said opposite polarity and the other terminal of said second control device being coupled to one terminal of said second coil;
   a third switching means for switching said first potential, said third switching means being coupled to said source of said first potential of said first polarity;
   a third control device for controlling the flow of current, one terminal of said third control device being coupled to said source of said second potential of said first polarity and the other terminal of said third control device being coupled to said one terminal of said second coil;
   a fourth switching means for switching said first potential, said fourth switching means being coupled to said source of said first potential of said opposite polarity;
   a fourth control device for controlling the flow of current, one terminal of said fourth control device being coupled to the source of said second potential of said opposite polarity and the other terminal of said fourth control device being coupled to said one terminal of said first coil;
   control means for
   (i) causing said first and second switching means and said first and second control devices to conduct them when current is being changed and said current is in a first direction; and,
   (ii) causing said third and fourth switching means and said third and fourth control devices to conduct when current is being changed and said current is in an opposite direction; and,
   causing said first, second, third and fourth control devices to conduct and operate as linear devices when the current through said coils is in a steady state condition,
   whereby current from said first potential is used for rapidly changing the current in said coils and whereby current from said second potential is used through said control devices for controlling the steady state flow of current through said coils.

11. The power supply defined by claim 10 wherein said control means forces said first and second control devices to fully conduct when said first and second switching means are conducting, and forces said third and fourth control devices to fully conduct when said third and fourth switching means are conducting.

12. The power supply defined by claim 11 including sensing means for sensing the current in said coils, and for sensing any imbalance in current in said coils, said sensing means being coupled to said control means and said coils.

13. The power supply defined by claim 12 wherein the common terminal between said first and second coils is coupled to ground and to said sensing means.

14. The power supply defined by claim 10 including comparator means for comparing the current through said coils with the desired current and for causing either said first and second or said third and fourth switching means and control means to conduct when the difference between said current and said desired current exceeds a predetermined level, said comparator means being coupled to said control means.

15. The power supply defined by claim 14 wherein each of said switching means comprises a plurality of first bipolar transistors which are driven by a plurality of first field-effect devices.

16. The apparatus defined by claim 15 wherein each of said control devices comprises a plurality of second bipolar transistors which are driven by a plurality of second field-effect devices.

17. The apparatus defined by claim 10 including fault detection means for detecting faults in said power supply and for causing the current through said coils to be interrupted upon the detection of said faults.

18. The device defined by claim 17 wherein said first and second sources of potential are derived from a three-phase power supply and wherein said fault detection means detects the loss of one or more of said phases of power.

19. The apparatus defined by claim 18 wherein said fault detection means includes:
   a first gate coupled to receive the first and second phases of said three-phase power;
   a second gate coupled to the output of said first gate and coupled to receive the third phase of power;
   the output of said second gate being coupled to a multivibrator, for triggering said multivibrator.

20. The apparatus defined by claim 19 wherein said first and second gates are exclusive OR gates.

* * * * *

UNITED STATES PATENT AND TRADEMARK OFFICE
CERTIFICATE OF CORRECTION

PATENT NO. : 4,437,053
DATED : Mar. 13, 1984
INVENTOR(S) : Bax

It is certified that error appears in the above-identified patent and that said Letters Patent is hereby corrected as shown below:

| COLUMN | LINE | DESCRIPTION |
|--------|------|-------------|
| 4 | 21 | Delete "devicees" and insert --devices--. |
| 9 | 2 | Delete "not" and insert --note--. |
| 9 | 21 | Delete "122" and insert --112--. |
| 10 | 7 | Between the words "field" and "device" insert --effect--. |
| 11 | 59 | Delete "them". |

Signed and Sealed this

Fourteenth Day of April, 1987

Attest:

DONALD J. QUIGG

*Attesting Officer*        Commissioner of Patents and Trademarks